(12) United States Patent  
Toida et al.

(10) Patent No.: US 10,267,862 B2  
(45) Date of Patent: Apr. 23, 2019

(54) FUEL CELL SYSTEM WITH MINIMUM CELL VOLTAGE ESTIMATION

(75) Inventors: Masashi Toida, Nagoya (JP); Yoshiaki Naganuma, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 688 days.

(21) Appl. No.: 14/372,504

(22) PCT Filed: Jan. 17, 2012

(86) PCT No.: PCT/JP2012/050862  
§ 371 (c)(1),  
(2), (4) Date: Jul. 16, 2014

(87) PCT Pub. No.: WO2013/108369  
PCT Pub. Date: Jul. 25, 2013

(65) Prior Publication Data  
US 2014/0333316 A1  Nov. 13, 2014

(51) Int. Cl.  
*G01R 31/36* (2006.01)  
*H01M 8/0432* (2016.01)  
(Continued)

(52) U.S. Cl.  
CPC ....... *G01R 31/3658* (2013.01); *G01R 31/362* (2013.01); *G01R 31/3606* (2013.01);  
(Continued)

(58) Field of Classification Search  
CPC ........... G01R 31/3658; G01R 31/3606; H01M 8/04298; H01M 8/0488; H01M 8/04559;  
(Continued)

(56) References Cited

U.S. PATENT DOCUMENTS 7,993,786 B2 *  8/2011  Shimoi ............. H01M 8/04097  
429/428  
2004/0150405 A1 *  8/2004  Burany ............. H01M 8/04552  
324/426  
(Continued)

FOREIGN PATENT DOCUMENTS

JP  2006-508508 A  3/2006  
JP  2008-021611 A  1/2008  
(Continued)

*Primary Examiner* — Drew A Dunn  
*Assistant Examiner* — Harry O'Neill-Becerril  
(74) *Attorney, Agent, or Firm* — Hunton Andrews Kurth LLP

(57) ABSTRACT

A fuel cell system comprises: a fuel cell formed of a plurality of cells stacked therein, each cell generating electric power through an electrochemical reaction between a fuel gas and an oxidant gas; a cell monitor capable of detecting a group voltage for each group wherein each group is composed of two or more cells; and an estimation device that estimates a minimum cell voltage. The estimation device comprises a maximum cell voltage estimation part that estimates a maximum cell voltage, and the estimation device estimates the minimum cell voltage by using an estimated value of the maximum cell voltage and a minimum group-average voltage, where an average voltage of a group having the lowest voltage value among the group voltages is defined as the minimum group-average voltage.

7 Claims, 3 Drawing Sheets

(51) Int. Cl.
*H01M 8/04537* (2016.01)
*H01M 8/04858* (2016.01)
*G01R 19/165* (2006.01)

(52) U.S. Cl.
CPC ..... *H01M 8/0488* (2013.01); *H01M 8/04365* (2013.01); *H01M 8/04552* (2013.01); *H01M 8/04559* (2013.01); *H01M 8/04589* (2013.01); *G01R 19/16542* (2013.01); *H01M 2250/20* (2013.01); *Y02T 90/32* (2013.01)

(58) Field of Classification Search
CPC ......... H01M 8/04992; H01M 8/04641; H01M 8/04552; H01M 8/04582; H01M 8/04619; Y02E 60/50
USPC ......... 324/426; 320/116, 117, 118, 119, 120, 320/121, 122, 123; 429/428, 412, 423, 429/424, 426
See application file for complete search history.

(56) References Cited

U.S. PATENT DOCUMENTS

| | | | |
|---|---|---|---|
| 2008/0032163 A1* | 2/2008 | Usborne ........... | H01M 8/04223 429/429 |
| 2008/0176117 A1* | 7/2008 | Koike ............... | H01M 8/04223 429/413 |
| 2010/0114513 A1* | 5/2010 | Mallavarapu ..... | H01M 8/04552 702/64 |
| 2010/0226241 A1* | 9/2010 | Schmatz .................. | H04B 3/32 370/201 |

FOREIGN PATENT DOCUMENTS

| | | | |
|---|---|---|---|
| JP | 2008021611 A | * | 1/2008 |
| JP | 2008-130443 A | | 6/2008 |

* cited by examiner

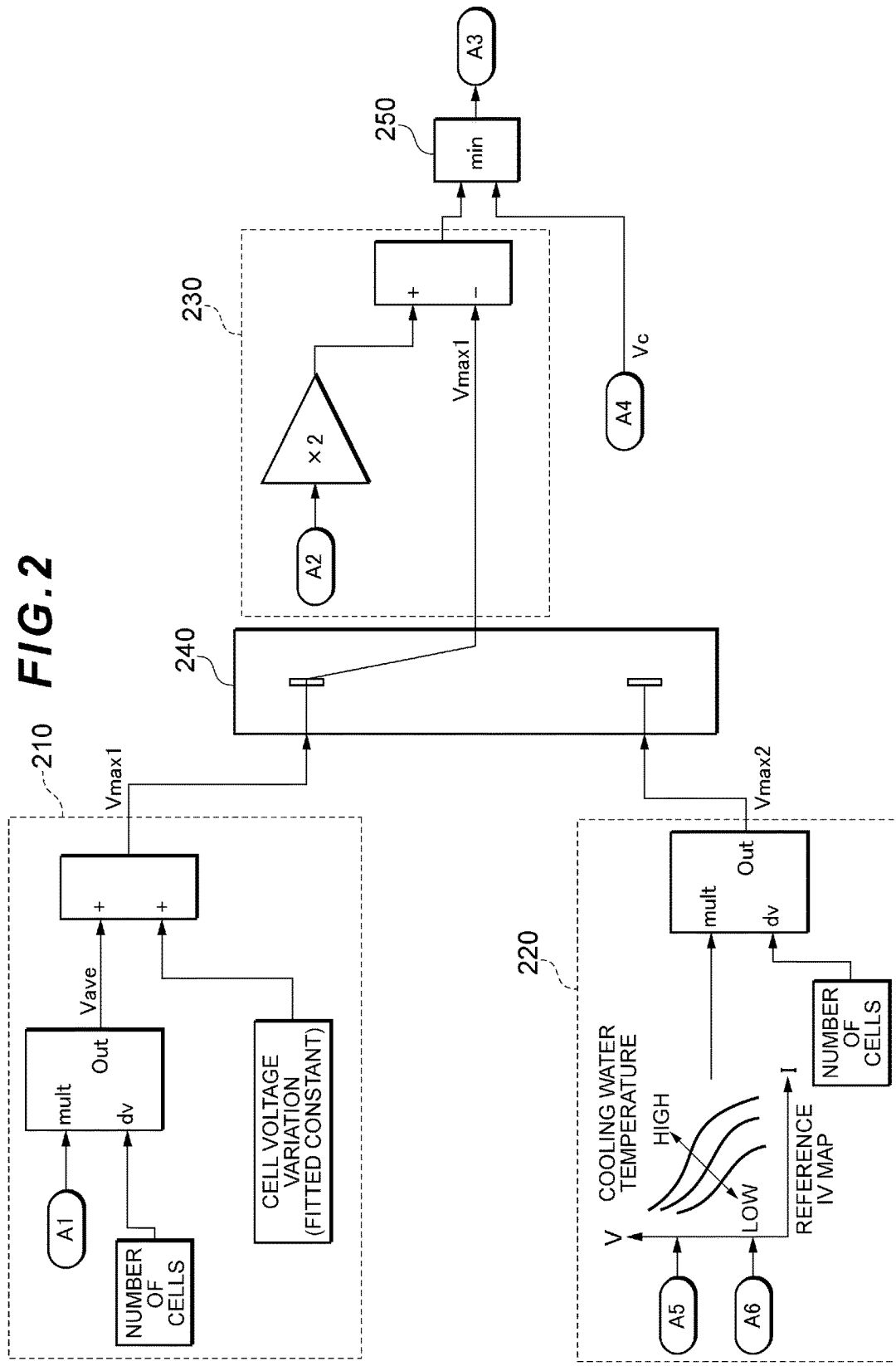

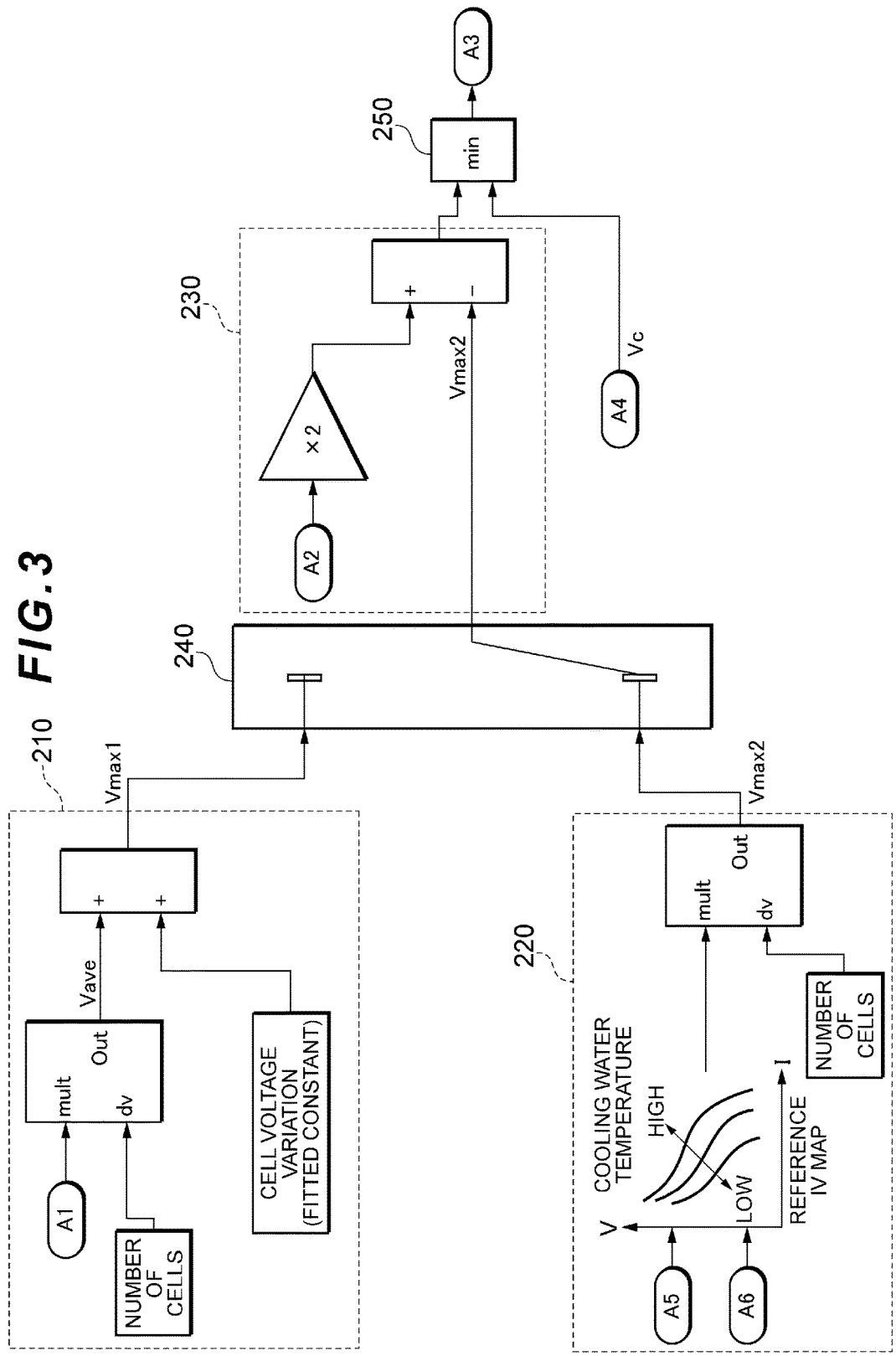

FUEL CELL SYSTEM WITH MINIMUM CELL VOLTAGE ESTIMATION

CROSS-REFERENCE TO RELATED APPLICATIONS

This is a national phase application based on the PCT International Patent Application No. PCT/JP2012/050862 filed Jan. 17, 2012, the entire contents of which are incorporated herein by reference.

TECHNICAL FIELD

The present invention relates to a fuel cell system that uses, as an energy source, a fuel cell formed of a plurality of cells stacked therein, each cell generating electric power through an electrochemical reaction between an oxidant gas and a fuel gas. The invention particularly relates to a technique for monitoring cell voltages.

BACKGROUND ART

Various types of fuel cell systems that use a fuel cell generating electric power through an electrochemical reaction between a fuel gas and an oxidant gas as an energy source have been developed heretofore. In many of such systems, the fuel cell has a stack structure with numerous cells, acting as minimum units of power generation, stacked therein. Each cell has an MEA (membrane-electrode assembly) in which an air electrode and a fuel electrode are disposed on both sides of an electrolyte membrane formed of an ion exchange membrane, and also has a pair of separators arranged on both sides of the MEA.

In such fuel cell system having a stack-structure fuel cell, it is necessary to constantly monitor each cell to determine whether the cell is exhibiting the desired power-generation performance, and thus, such fuel cell system is usually equipped with a cell monitor. Since the number of stacked cells is large, e.g., several tens or several hundreds, some cell monitors monitor the output voltage in groups, with one group being composed of several cells, instead of detecting the output voltage of every cell.

However, such voltage monitoring in groups cannot identify the minimum cell voltage, even though it can identify a group which includes a cell with a voltage decreasing to a value equal to or lower than a predetermined voltage value. As a solution to the above, for example, the technique disclosed in cited reference 1 estimates the minimum cell voltage at a value obtained by subtracting an average cell voltage from a minimum group voltage.

PRIOR ART REFERENCE

Patent Document

Patent Document 1: JP2008-021611 A

SUMMARY OF THE INVENTION

Problem to be Solved by the Invention

If a cell voltage decreases below a predetermined threshold and if the cell is left as it is, the cell will become overheated, which could result in the electrolyte membrane melting and thereby causing a hole in the electrolyte membrane. Thus, certain measures, e.g., limiting the output current of the fuel cell, are required.

However, if the minimum cell voltage is estimated with low accuracy, the minimum cell voltage may be misunderstood as being equal to or greater than a predetermined threshold and the output control of the fuel cell may be performed under such misunderstanding. As a result, despite the actual cell voltage becoming lower than the predetermined threshold, the cell is left as it is, without any limitation processing, such as decreasing the output current of the fuel cell, being performed.

The accuracy in estimation of the minimum cell voltage can be increased to some extent based on to the technique disclosed in Patent Document 1. However, when considering the cell voltages by dividing them into relatively lower cell voltages and relatively higher cell voltages, the voltage variation between cells is wider in the lower cell voltages than in the higher cell voltages, and, in view of the above, estimating the actual minimum cell voltage from the difference between the minimum group voltage and the average cell voltage involves certain limits in terms of achieving an estimate with a high level of accuracy.

The present invention has been made in view of the above-described circumstances. An object of the present invention is to provide a fuel cell system capable of suppressing any damage to the fuel cell due to a drop in cell voltage by enhancing the accuracy in estimating the minimum cell voltage.

Means for Solving the Problem

In order to achieve the above object, a fuel cell system according to the present invention comprises: a fuel cell formed of a plurality of cells stacked therein, each cell generating electric power through an electrochemical reaction between a fuel gas and an oxidant gas; a cell monitor capable of detecting a group voltage for each group wherein each group is composed of two or more cells; and an estimation device that estimates a minimum cell voltage, wherein the estimation device comprises a maximum cell voltage estimation part that estimates a maximum cell voltage, and wherein the estimation device estimates the minimum cell voltage by using an estimated value of the maximum cell voltage and a minimum group-average voltage, where an average voltage of a group having the lowest voltage value among the group voltages is defined as the minimum group-average voltage.

As a result of intensive studies on the methods of estimating the minimum cell voltage, the inventors of the present invention have found that the variation of the maximum cell voltage is smaller than that of the minimum cell voltage. The present invention has been made based on this finding and estimates the minimum cell voltage using an estimated value of the maximum cell voltage. With this configuration, the minimum cell voltage can be estimated more accurately.

In the above-described configuration, one group is composed of two cells and the estimation device may estimate the minimum cell voltage at a value obtained by subtracting an estimated value of the maximum cell voltage from a value calculated by multiplying the minimum group-average voltage by two.

With this configuration, the situation in which a combination of two cells may be the most undesirable combination, i.e., a combination of the cell outputting the minimum voltage in all the cells and the cell outputting the maximum cell voltage, is taken into consideration and an occurrence of the problem of estimating the minimum cell voltage as being higher than the actual voltage is suppressed.

The estimation device may use different methods for estimating the maximum cell voltage at the maximum cell voltage estimation part in an operation with an insufficient supply of oxidant gas in which an amount of oxidant gas supplied to the fuel cell is equal to or lower than a predetermined value, and in other normal operations.

With this configuration, the maximum cell voltage is estimated by selecting an estimation method that would lead to higher estimation accuracy according to the operation condition of the fuel cell.

For example, in the normal operations, the maximum cell voltage estimation part may set, as an estimated value of the maximum cell voltage, a value calculated by adding a constant, which represents a voltage variation between cells, to an average voltage which is obtained by dividing the total voltage of the fuel cell by the total number of the cells.

In the operation with an insufficient supply of oxidant gas, the maximum cell voltage estimation part may set, as an estimated value of the maximum cell voltage, a value calculated by: estimating an output voltage of the fuel cell based on a temperature and an output current of the fuel cell as well as a current-voltage map which shows the relationship between the current and voltage of the fuel cell; and dividing the estimated output voltage by the total number of the cells.

If the cell monitor is configured to be able to detect a cell voltage of each end cell located at both ends of the fuel cell in the cell stacking direction, the estimation device may compare a minimum cell voltage among the end cells with the estimated minimum cell voltage estimated using the minimum group-average voltage and an estimated value of the maximum cell voltage, and estimate the minimum cell voltage as being the smallest value among the compared voltage values.

The amount of water produced through the electrochemical reaction is large in the end cells compared to the other cells and if such produced water is not discharged properly, the cell voltages of the end cells become lower than those of the other cells.

With the configuration described above, the estimated minimum cell voltage or the minimum cell voltage among the end cells, whichever is smaller, is set as an estimated value of the minimum cell voltage. Accordingly, such configuration can further ensure the suppression of an occurrence of the problem of estimating the minimum cell voltage as being a higher value than the actual voltage.

If the fuel cell system comprises an output control device that controls an output of the fuel cell, the control device may perform control for recovering cell voltage when the control device detects that the minimum cell voltage estimated by the estimation device is below a predetermined low-voltage threshold.

With this configuration, since a measure for recovering cell voltage is taken when the cell voltage of a particular cell decreases below a predetermined threshold, it is possible to prevent breakage of the fuel cell.

Effect of the Invention

The present invention can improve the accuracy of estimating the minimum cell voltage and suppress any damage to the fuel cell due to a drop in cell voltage.

BRIEF DESCRIPTION OF THE DRAWINGS

FIG. 2 is a block diagram showing one example of control performed by a control device 200 shown in FIG. 1.

FIG. 3 is a block diagram showing another example of control performed by the control device 200 shown in FIG. 1

MODE FOR CARRYING OUT THE INVENTION

Figure 1:
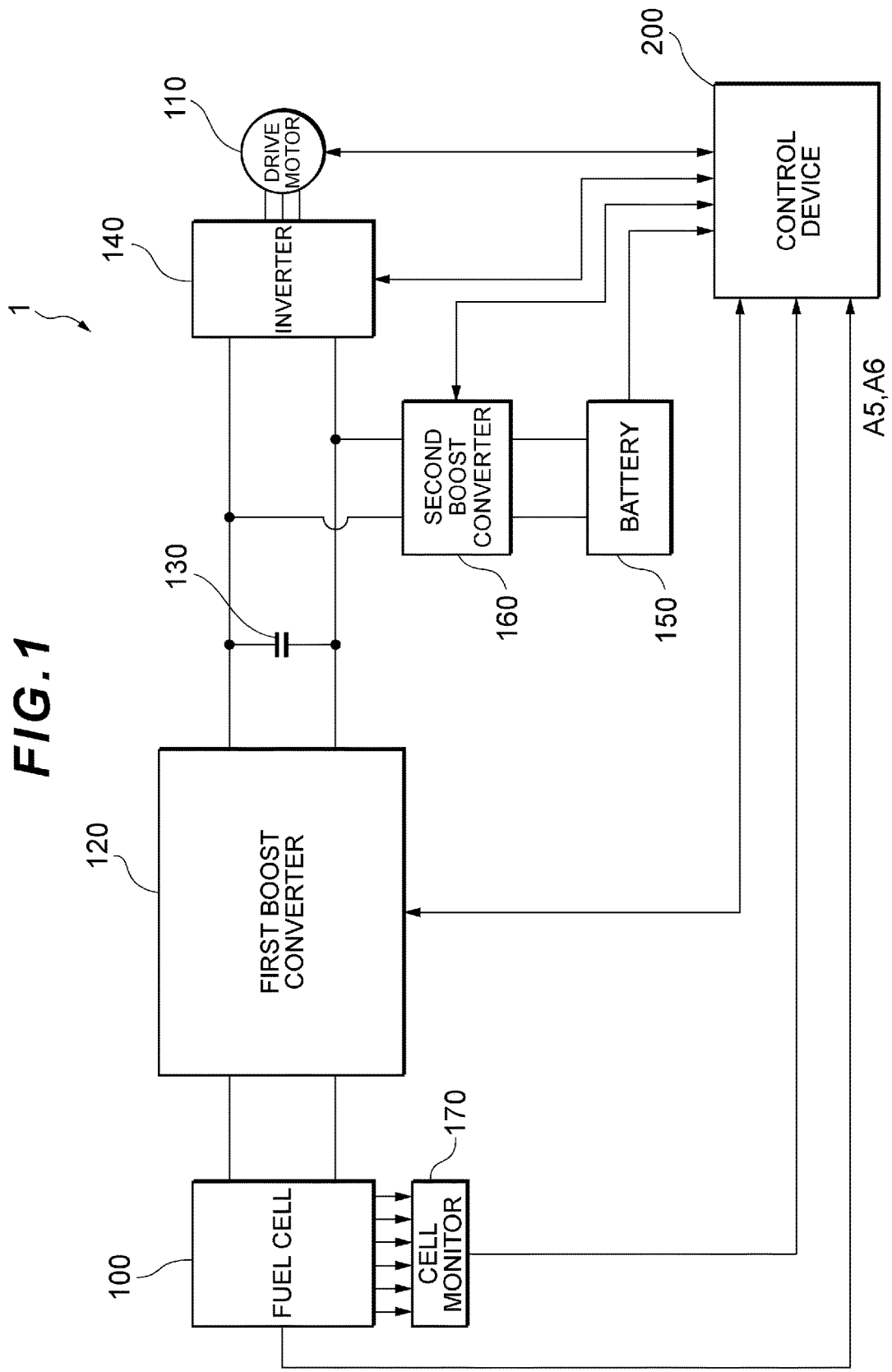
FIG. 1 is a schematic circuit diagram of a fuel cell system according to an embodiment of the present invention.

An embodiment of the fuel cell system according to the present invention will be described below with reference to the attached drawings. This embodiment will describe an example in which the fuel cell system according to the present invention is used as an on-vehicle power generation system for a fuel cell vehicle (fuel cell hybrid vehicle: FCHV).

As illustrated in FIG. 1, a fuel cell system 1 has a fuel cell 100 which generates electric power through an electrochemical reaction between an oxidant gas and a fuel gas serving as reactant gases. The fuel cell 100 is, for example, a polymer electrolyte-type fuel cell and has a stack structure with numerous cells stacked therein.

Each cell has an air electrode on one surface of an electrolyte formed of an ion-exchange membrane and a fuel electrode on the other surface of the electrolyte, and also has a pair of separators that sandwich the air electrode and the fuel electrode therebetween. In this configuration, hydrogen gas is supplied to a hydrogen gas flow path of one separator while air serving as the oxidant gas is supplied to an oxidant gas flow path of the other separator so as to cause the electrochemical reaction between these reactant gases and thereby generate electric power.

The fuel cell 100 has a cell monitor (output voltage sensor) 170 connected thereto for measuring voltages of each cell and group voltages of each group made of several cells. For example, if the fuel cell 100 has 200 cells in total, a cell voltage terminal is provided for each of the 10 cells on one end in the cell stacking direction and for each of the 10 cells on the other end, while one cell voltage terminal is provided for every two cells among the remaining 180 cells.

In other words, regarding the several cells located on both ends in the cell stacking direction (hereinafter, such cells will also be referred to as "end cells"), the cell monitor 170 can monitor the cell voltage for each cell, and regarding the remaining cells (hereinafter, such cells will also be referred to as "center cells"), the cell monitor 170 can monitor group voltages, with one group voltage for two cells, as well as the average cell voltage of such two cells (the average of the group voltage). In addition, the cell monitor 170 can monitor the total voltage of the fuel cell 100 by summing up the voltages on a cell-to-cell basis and the respective group voltages.

The fuel cell 100 is connected to a drive motor (load) 110 for running a vehicle and supplies electric power to the drive motor 110. On the power supply path from the fuel cell 100 to the drive motor 110, a first boost converter 120 for the fuel cell 100, a capacitor 130 and a drive inverter 140 are connected in this order, beginning from the fuel cell 100 side. The voltage of the power generated by the fuel cell 100 is increased in the first boost converter 120 and the resulting power is then supplied to the drive motor 110 through the drive inverter 140.

The first boost converter 120 is, for example, a multiphase (multiple phases) converter having a plurality (e.g., four) of booster parts and each booster part has a reactor, a transistor and a diode. It should be noted that the first boost converter 120 may by a single phase converter.

The drive motor 110 is, for example, a three-phase alternating current motor. The drive inverter 140, to which the drive motor 110 is connected, converts direct current into a three-phase alternating current and supplies the alternating current to the drive motor 110.

The fuel cell system 1 has a battery 150 capable of discharging electric power to the drive motor 110 and also capable of being charged with electric power from the fuel cell 100. A second boost converter 160 for the battery 150 is connected to the power supply path from the battery to the drive motor 110.

The power supply path of the battery 150 is connected to the power supply path of the fuel cell 100, so that the electric power from the battery 150 can be supplied to the drive motor 110.

The second boost converter 160 is a direct current voltage converter and has functions of: regulating a direct current voltage input from the battery 150 and outputting it to the drive motor 110; and regulating a direct current voltage input from the fuel cell 100 or the drive motor 110 and outputting it to the battery 150. The above functions of the second boost converter 160 enable the charging/discharging of the battery 150.

The fuel cell system 1 has a control device (estimation device, output control device) 200. The fuel cell 100, the first boost converter 120, the battery 150, the second boost converter 160, the drive inverter 140 and the drive motor 110 are connected to the control device 200. The control device 200 performs overall controls for these connected devices.

The cell monitor 170 connected to the fuel cell 100 is also connected to the control device 200, and the results of detection by the cell monitor 170 are sent to the control device 200. The present embodiment describes an example in which, regarding the cells other than the cells at both ends in the cell stacking direction, i.e., the center cells, the cell monitor 170 detects a group voltage of each two-cell group with one channel; however, a group voltage of three or more cells may be detected with one channel.

Next, an example of the processing for estimating the minimum cell voltage and an example of the voltage recovery control using an estimated value of the minimum cell voltage will be described with reference to FIG. 2. The above processing and control are performed by the control device 200.

A first feature of the present embodiment resides in estimating the minimum cell voltage using an estimated value of the maximum cell voltage and a second feature resides in using different methods for estimating the maximum cell voltage in normal power generation and in an operation with an insufficient supply of oxidant gas. Firstly, the respective estimation methods of the maximum cell voltage to be used in normal power generation and in an operation with an insufficient supply of oxidant gas will be described.

<In Normal Power Generation>

A first maximum cell voltage estimation part 210 first determines the total voltage of the fuel cell 100. The total voltage A1 of the fuel cell 100 may be the sum of each cell voltage of the end cells and each group voltage of the center cells, which are detected by the cell monitor 170. Alternatively, if the fuel cell system 1 has a voltage sensor that detects an output voltage of the fuel cell 100, the total voltage A1 may be the value detected by this voltage sensor.

Secondly, the average cell voltage $V_{ave}$ of the fuel cell 100 is determined from the total voltage A1 of the fuel cell 100 and the number of cells in the fuel cell 100, with such number being stored in advance in memory in the control device 200 (200 cells in the present embodiment). More specifically, the average cell voltage $V_{ave}$ is obtained by dividing the total voltage A1 of the fuel cell 100 by the number of cells.

The actual value of the cell voltage may vary from cell to cell. If such variation between cells is not taken into account, the operation control of the fuel cell 100 may be performed inappropriately without considering the existence of cells that output a voltage lower than the average cell voltage $V_{ave}$, even though such cells actually exist, and this would be a disadvantageous situation.

Considering the possibility that a combination of two cells may be a combination of a cell outputting the minimum voltage among all of the cells and a cell outputting the maximum cell voltage among all of the cells, such combination being the most unfavorable combination, the present embodiment is configured so as to first estimate the maximum cell voltage based on the average cell voltage $V_{ave}$.

The voltage variation between cells is preliminarily quantified to a certain constant, for example, by statistically processing the results of experiments or simulations, and the obtained constant is stored in the memory of the control device 200. The value obtained by adding such constant to the average cell voltage $V_{ave}$ is set as a first estimated maximum cell voltage $V_{max1}$. Examples of the constant that can be used may include, but are not limited to, a fitted constant and a standard deviation.

The voltage variation between cells is represented by, for example, a normal distribution. The voltage variation between cells differs according to the operation conditions of the fuel cell 100, such as the temperature of the fuel cell 100 or the temperature of cooling water for the fuel cell 100, the output current of the fuel cell 100, and the electric power required for the load or the fuel cell 100. Thus, a voltage variation between cells may be set and mapped according to the respective operation conditions of the fuel cell 100 so that different maps can be used for different conditions.

<In Operation with Insufficient Supply of Oxidant Gas>

If the amount of oxidant gas supplied to the fuel cell 100 is lower than a predetermined value, during, for example, a rapid warm-up operation or an intermittent operation, then the cell voltages vary greatly. Herein, a rapid warm-up operation refers to an operation for start-up at low temperature (e.g., start-up at a temperature below zero) to reduce the generation efficiency by decreasing the air stoichiometric ratio to be lower than that of the normal operation and to instead increase the amount of heat generated by the fuel cell 100. Further herein, an intermittent operation refers to an operation for temporarily stopping the supply of oxidant gas and fuel gas to the fuel cell 100 during a low-load operation (e.g., idling or driving in a traffic jam).

In the above-described cases in which the supply of oxidant gas is insufficient, the values detected by the cell monitor 170 are not used, but instead, a second maximum cell voltage estimation part 220 refers to a reference IV map (current-voltage map) which shows the relationship between the output current and output voltage of the fuel cell 100 in normal power generation. Since the IV curve varies depending on the temperature (cooling water temperature) of the fuel cell 100, the maximum cell voltage is estimated using the above-described reference IV map, and a temperature (or a cooling water temperature) A5 and an output current A6 of the fuel cell 100.

More specifically, an output voltage V of the fuel cell 100, which is estimated from the reference IV map, is divided by the number of cells and the resulting value is set as a second estimated maximum cell voltage $V_{max2}$. The reference IV map is stored in the memory in the control device 200.

Next, the process of estimating the minimum cell voltage using the maximum cell voltage estimated as described above will be explained.

A minimum cell voltage estimation part 230 first identifies, from among the respective groups of the center cells, the lowest average cell voltage, i.e., the minimum channel voltage (minimum group-average voltage) A2. After that, either a first estimated maximum cell voltage $V_{max1}$ or a second estimated maximum cell voltage $V_{max2}$ is selected using a switch 240, according to the operation condition of the fuel cell 100, and the selected value is subtracted from a value calculated by multiplying the above-identified minimum channel voltage A2 by two, thereby obtaining a preliminary estimated value of the minimum cell voltage.

In other words, during the normal operation, a preliminary estimated value $V_{min1}$ of the minimum cell voltage is obtained by subtracting the first estimated maximum cell value $V_{max1}$ from a value calculated by multiplying the minimum channel voltage A2 by two, as shown in FIG. 2. Meanwhile, when the supply of oxidant gas is insufficient, a preliminary estimated value $V_{min2}$ of the minimum cell voltage is obtained by subtracting the second estimated maximum cell voltage $V_{max2}$ from a value calculated by multiplying the minimum channel voltage A2 by two, as shown in FIG. 3.

After that, a comparison and setting part 250 compares the thus obtained preliminary estimated value $V_{min1}$ or $V_{min2}$ of the minimum cell voltage with each cell voltage Vc of the end cells, and the smallest value of those is finally selected and set as an estimated minimum cell voltage A3.

When the control device 200 detects that the estimated minimum cell voltage A3 is lower than a predetermined low-voltage threshold, the control device 200 performs voltage recovery control, such as restricting the upper limit of the output current of the fuel cell 100 or increasing the amount of supply of oxidant gas (air blowing). With such control, it is possible to prevent any breakage of the fuel cell 100 due to the cell voltage of a particular cell becoming lower than a predetermined threshold.

Furthermore, the minimum cell voltage is estimated using an estimated value of the maximum cell voltage ($V_{max1}$ or $V_{max2}$) in the present embodiment. This is based on the present inventors' finding that the variation of the maximum cell voltage is smaller than that of the minimum cell voltage.

According to the above finding, the minimum cell voltage can be estimated with higher accuracy than in the case where the minimum channel voltage A2 is directly set as an estimated value of the minimum cell voltage or the case where the technique disclosed in Patent Document 1 is used. Thus, the present embodiment can ensure that any breakage of the fuel cell 100 is prevented and, at the same time, can also suppress the above-described voltage recovery control, wherever possible.

Furthermore, in the present embodiment, different methods for estimating the maximum cell voltage are used in the normal operation and in the operation with an insufficient supply of oxidant gas. As a result, in the normal operation where the voltage variation between cells is relatively small, the actual value of the cell voltage, i.e., the voltage detected by the cell monitor 170, is used to estimate the maximum cell voltage, thereby allowing the minimum cell voltage to be estimated more accurately than in the case of referring to the reference IV map to obtain an estimated maximum cell voltage.

On the other hand, in the operation with an insufficient supply of oxidant gas, which involves a relatively large voltage variation between cells, the maximum cell voltage is estimated by referring to the reference IV map instead of using the voltage detected by the cell monitor 170, thereby allowing the minimum cell voltage to be estimated more accurately than in the case of using the actual value.

Although, the above embodiment describes an example in which one group is composed of two cells, one group may also be composed of three or any larger number of cells and the cell voltages of such three or more cells may be monitored with a single channel.

For example, when the number of cells that constitute one group is represented by N, the minimum cell voltage estimation part 230 can obtain an estimated value or a preliminary estimated value of the minimum cell voltage by subtracting (N−1) times the first estimated maximum cell voltage $V_{max1}$ or $V_{max2}$ from N times the minimum cell group voltage A2.

DESCRIPTION OF REFERENCE NUMERALS

1 . . . fuel cell system; 100 . . . fuel cell; 170 . . . cell monitor (output voltage sensor); 200 . . . control device (estimation device, output control device); 210 . . . first maximum cell voltage estimation part; 220 . . . second maximum cell voltage estimation part; 230 . . . minimum cell voltage estimation part; 240 . . . switch; 250 . . . comparison and setting part

What is claimed is:

1. A fuel cell system comprising:
  a fuel cell including a fuel cell stack formed of a plurality of cells stacked therein, each cell generating electric power through an electrochemical reaction between a fuel gas and an oxidant gas;
  a cell monitor configured to detect voltages of each cell and group voltages for groups of two or more cells of the fuel cell stack;
  an output control device configured to control an output of the fuel cell stack; and
  an estimation device that estimates a minimum cell voltage of the fuel cell stack, wherein
  the estimation device comprises a maximum cell voltage estimation part that estimates a maximum cell voltage of the fuel cell stack, and when an average voltage of one of the groups of two or more cells having the lowest voltage value among the group voltages is defined as the lowest group average voltage, the estimation device estimates the minimum cell voltage of the fuel cell stack by utilizing the lowest group average voltage and t estimated maximum cell voltage of the fuel cell stack; and
  the control device performs control for recovering cell voltage of the fuel cell stack when the control device detects that the minimum cell voltage of the fuel cell stack estimated by the estimation device is below a predetermined low-voltage threshold.

2. The fuel cell system according to claim 1, wherein the estimation device estimates the minimum cell voltage of the fuel cell stack at a value obtained by subtracting an estimated value of the maximum cell voltage of the fuel cell stack from a value calculated by multiplying the minimum group-average voltage by two.

3. The fuel cell system according to claim 1, wherein the estimation device uses different methods for estimating the maximum cell voltage of the fuel cell stack at the maximum cell voltage estimation part in an operation with an insufficient supply of oxidant gas in which an amount of oxidant gas supplied to the fuel cell stack is equal to or lower than a predetermined value, and in other normal operations.

4. The fuel cell system according to claim 3, wherein; in the normal operations, the maximum cell voltage estimation part sets, as an estimated value of the maximum cell voltage of the fuel cell stack, a value calculated by adding a constant, which represents a voltage variation between cells, to an average voltage which is obtained by dividing a total voltage of the fuel cell stack by a total number of the plurality of cells.

5. The fuel cell system according to claim 3, wherein, in the operation with an insufficient supply of oxidant gas, the maximum cell voltage estimation part sets, as an estimated value of the maximum cell voltage of the fuel cell stack, a value calculated by: estimating an output voltage of the fuel cell stack based on a temperature and an output current of the fuel cell stack as well as a current-voltage map which shows the relationship between a current and a voltage of the fuel cell stack; and dividing the estimated output voltage by a total number of the plurality of cells.

6. The fuel cell system according to claim 1, wherein the cell monitor is configured to be able to detect the cell voltage of each end cell of the fuel cell stack in the cell stacking direction, and wherein the estimation device compares a minimum cell voltage among the end cells with the estimated minimum cell voltage estimated using the minimum group-average voltage and an estimated value of the maximum cell voltage, and estimates the minimum cell voltage as being the smallest value among the compared voltage values.

7. The fuel cell system according to claim 1, wherein the estimation device estimates the minimum cell voltage by subtracting (N−1) times the maximum cell voltage from N times the minimum group-average voltage.

* * * * *